United States Patent [19]

Takeda

[11] Patent Number: 4,920,507
[45] Date of Patent: Apr. 24, 1990

[54] RECURSIVE DIGITAL FILTER WITH LESS NO-SIGNAL NOISE

[75] Inventor: Masahiro Takeda, Tokyo, Japan

[73] Assignee: NEC Corporation, Tokyo, Japan

[21] Appl. No.: 387,298

[22] Filed: Jul. 31, 1989

[30] Foreign Application Priority Data

Jul. 29, 1988 [JP] Japan ................................ 63-189840

[51] Int. Cl.$^5$ ............................................. G06F 15/31
[52] U.S. Cl. ............................ 364/724.17; 364/724.03
[58] Field of Search ..................... 364/724.17, 724.01, 364/724.03

[56] References Cited

U.S. PATENT DOCUMENTS

| | | | |
|---|---|---|---|
| 3,619,586 | 11/1971 | Hoff, Jr. et al. | 364/724.17 |
| 4,117,541 | 9/1978 | Ali | 364/724.17 |
| 4,185,325 | 1/1980 | Appel | 364/724.17 |
| 4,467,440 | 8/1984 | Sano et al. | 364/724.17 |
| 4,507,725 | 3/1985 | Christopher et al. | 364/724.03 |
| 4,521,867 | 6/1985 | Kasuga | 364/724.17 |
| 4,523,291 | 6/1985 | Giubbolini et al. | 364/724.06 |
| 4,545,026 | 10/1985 | Baggett et al. | 364/724.13 |
| 4,750,146 | 6/1988 | Dalquist et al. | 364/724.03 X |
| 4,823,296 | 4/1989 | Millar | 364/724.03 |

OTHER PUBLICATIONS

Varoufakis et al, "Design and Implementation of a Special Class of Multiplierless Digital Filters", IEEE 1982, CH1681-6/82, pp. 523-526.

Primary Examiner—Gary V. Harkcom
Assistant Examiner—Tan V. Mai
Attorney, Agent, or Firm—Helfgott & Karas

[57] ABSTRACT

A recursive digital filter comprises an input terminal receiving an input signal, an output terminal for outputting a filtered signal, an offset value circuit for outputting a predetermined offset value, an adder having a first input connected to the input terminal and a second input connected to receive the predetermined offset value from the offset value circuit, and a recursive digital filter loop having an input connected to an output of the adder and an output connected to the output terminal. With this arrangement, the recursive digital filter loop receives the input signal added wtih the predetermined offset value, so that, even if the input signal is zero the recursive digital filter loop will process some signal which is not zero, and accordingly, the result of the processing of the recursive digital filter loop never becomes zero. Accordingly, the limit cycle caused due to accumulation of rounding error will not occur.

5 Claims, 2 Drawing Sheets

RECURSIVE DIGITAL FILTER WITH LESS NO-SIGNAL NOISE

BACKGROUND OF THE INVENTION

1. Field of the Invention

The present invention relates to a digital filter, and more specifically to improvement to a recursive digital filter to suppress noises in a no-signal condition.

2. Description of Related Art

In general, digital filters are composed of delay elements of one time slot delay or unit delay, multipliers for multiplication of constant values, and adders. The digital filter can be divided into a non-recursive filter and a recursive filter, and the latter is composed of a finite number of elements but is adapted to realize an infinite impulse response.

Referring to FIG. 1, there is shown one typical example of a conventional second-order recursive digital filter. The shown digital filter receives an input signal Xi and generates an output signal Yi, and includes a recursive digital filter loop composed two delay units $D_1$ and $D_2$, four multipliers $M_1$, $M_2$, $M_3$ and $M_4$, and four adders $A_2$, $A_3$, $A_4$ and $A_5$, coupled to one another as shown in FIG. 1.

The input signal Xi is supplied to a first input of the adder $A_2$, which has an output connected to an input of the delay unit $D_1$ and a first input of the adder $A_4$. An output of the delay unit $D_1$ is connected to respective inputs of the multipliers $M_1$ and $M_3$ and an input of another delay unit $D_2$. The multiplier $M_1$ multiplies the output of the delay unit $D_1$ by a constant $\beta_1$, and the multiplier $M_3$ multiplies the output of the delay unit $D_1$ by a constant $\alpha_1$. An output of the delay unit $D_2$ is connected to respective inputs of the multipliers $M_2$ and $M_4$. The multiplier $M_2$ multiplies the output of the delay unit $D_2$ by a constant $\beta_2$, and the multiplier $M_4$ multiplies the output of the delay unit $D_2$ by a constant $\alpha_2$. Outputs of the multipliers $M_1$ and $M_2$ are connected to two inputs of the adder $A_3$, respectively, so that the outputs of the multipliers $M_1$ and $M_2$ are added to each other, and an output of the adder $A_3$ is connected to a second input of the adder $A_2$. Thus, the outputs of the multipliers $M_1$ and $M_2$ are added to the input signal Xi. Therefore, a feedback loop or recursive loop is formed. On the other hand, outputs of the multipliers $M_3$ and $M_4$ are connected to two inputs of the adder $A_5$, respectively, and an output of the adder $A_5$ is connected to a second input of the adder $A_4$. An output of the adder $A_4$ generates the output signal Yi.

The above mentioned digital filter will execute an operation for a differential equation expressed in the following:

$$Wi = Xi + \beta_1 \cdot W_{i-1} = \beta_2 \cdot W_{i-2}$$

$$Yi = Wi + \alpha_1 \cdot W_{i-1} + \alpha_2 \cdot W_{i-2}$$

where $i = \ldots, -2, -1, 0, 1, 2, \ldots$
Xi = input signal
Yi = output signal
$\alpha_1, \alpha_2, \beta_1, \beta_2$ = constant
$Wi, W_{i-1}, W_{i-2}$ = delayed data As mentioned above, the conventional recursive digital filter is composed of delay units, multipliers and adders, each of which operates to execute a given operation in a finite length of word. Therefore, an error will inevitably occur due to rounding and truncation.

Thus, the error has been accumulated in the recursive digital filter loop of the conventional recursive digital filter, so that the result of operation will become non-linear. Particularly, when zero is inputted, a so-called limit cycle will occur in which the output will converge to a constant value which differs from zero, or the output value depicts a cyclic waveform. In other words, the output will not asymptotically approach to zero. This is a noise in a no-signal condition (no-signal noise), and this no-signal noise is a large problem in filtering a voice signal.

As means for preventing the occurrence of the limit cycle, it is considered to elongate the length of word in order to make small an error caused in rounding to a finite word length. This way requires a large amount of hardware, and therefore, is not preferably.

SUMMARY OF THE INVENTION

Accordingly, it is an object of the present invention to provide a recursive digital filter which has overcome the above mentioned defect of the conventional one.

Another object of the present invention is to provide a recursive digital filter which generates less no-signal noise without requiring a substantially increased hardware.

The above and other objects of the present invention are achieved in accordance with the present invention by a recursive digital filter comprising an input terminal receiving an input signal, an output terminal for outputting a filtered signal, an offset value circuit for outputting a predetermined offset value, an adder having a first input connected to the input terminal and a second input connected to receive the predetermined offset value from the offset value circuit, and a recursive digital filter loop having an input connected to an output of the adder and an output connected to the output terminal.

With the above mentioned arrangement, the recursive digital filter loop receives the input signal added with the predetermined offset value. Therefore, even if the input signal is zero, namely, even in a no-signal condition, the recursive digital loop will process some signal which is not zero, and accordingly, the result of the processing of the recursive digital filter loop never becomes zero. Thus, the limit cycle caused due to accumulation of rounding error will not occur. In other words, the no-signal noise is suppressed.

In the recursive digital filter as mentioned above, furthermore, it is not needed to elongate the length of a word being processed, and the increase of the required hardware is very small. Accordingly, the recursive digital filter in accordance with the present invention can remove the no-signal noise without a substantial increase of cost.

The above and other objects, features and advantages of the present invention will be apparent from the following description of preferred embodiments of the invention with reference to the accompanying drawings.

DESCRIPTION OF THE PREFERRED EMBODIMENTS

Figure 1:
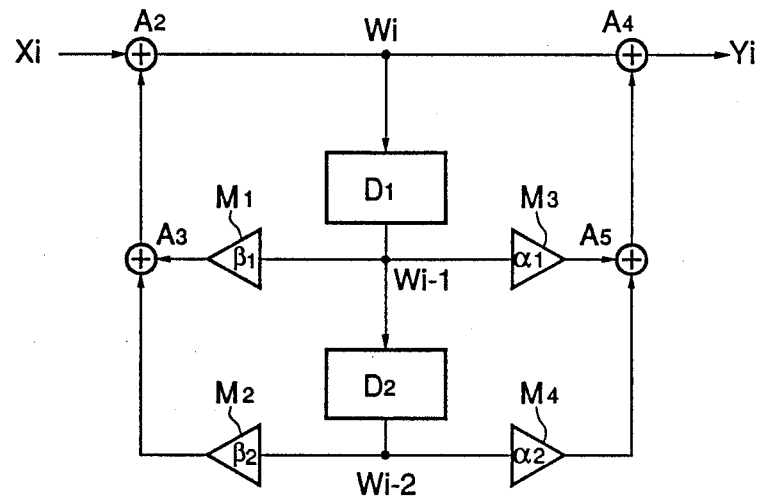
FIG. 1 is a block diagram of a typical example of the conventional recursive digital filter.
Figure 2:
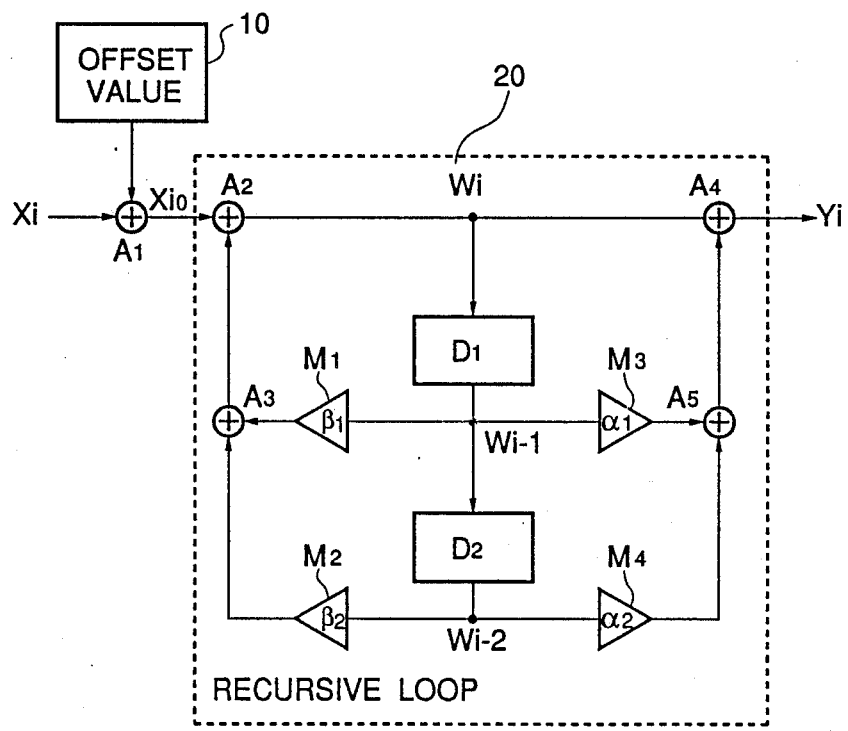
FIG. 2 is a block diagram of an embodiment of the recursive digital filter in accordance with the present invention.

Referring to FIG. 2, there is shown a block diagram of an embodiment of the recursive digital filter in accordance with the present invention. The digital filter shown in FIG. 2 is a second-order recursive filter, similar to that shown in FIG. 1, and therefore, in FIG. 2, elements similar to those shown in FIG. 1 are given the same Reference Numerals, and explanation thereof will be omitted.

As seen from comparison between FIGS. 1 and 2, the recursive digital filter shown in FIG. 2 comprises an adder $A_1$ having a first input receiving the input signal Xi, an offset value circuit 10 for outputting a predetermined offset value to a second input of the adder A1, and a second-order recursive digital filter loop 20 having an input connected to an output of the adder $A_1$ and an output for generating an output signal Yi. This recursive digital filter loop 20 is constructed similarly to the recursive digital filter shown in FIG. 1.

In the recursive digital filter shown in FIG. 2, the input signal Xi is inputted to the adder $A_1$, where the input signal Xi is added with the predetermined offset value supplied from the offset value circuit 10. As a result, an offset input signal Xio is inputted to the first input of the adder $A_2$ of the recursive digital filter loop 20. The recursive digital filter loop receiving the offset input signal Xio operates similarly to that of the recursive digital filter shown in FIG. 1.

Therefore, the digital filter shown in FIG. 2 will execute an operation for a differential equation expressed in the following:

$$Wi = Xio + \beta_1 \cdot W_{i-1} + \beta_2 \cdot W_{i-2}$$

$$Yi = Wi + \alpha_1 \cdot W_{i-1} + \alpha_2 \cdot W_{i-2}$$

As seen from the above equation, by setting the offset value at a suitable value, the signal Xio will not become zero when no signal is inputted as the input signal Xi, and therefore, the limit cycle due to the rounding error will not occur.

Figure 3:
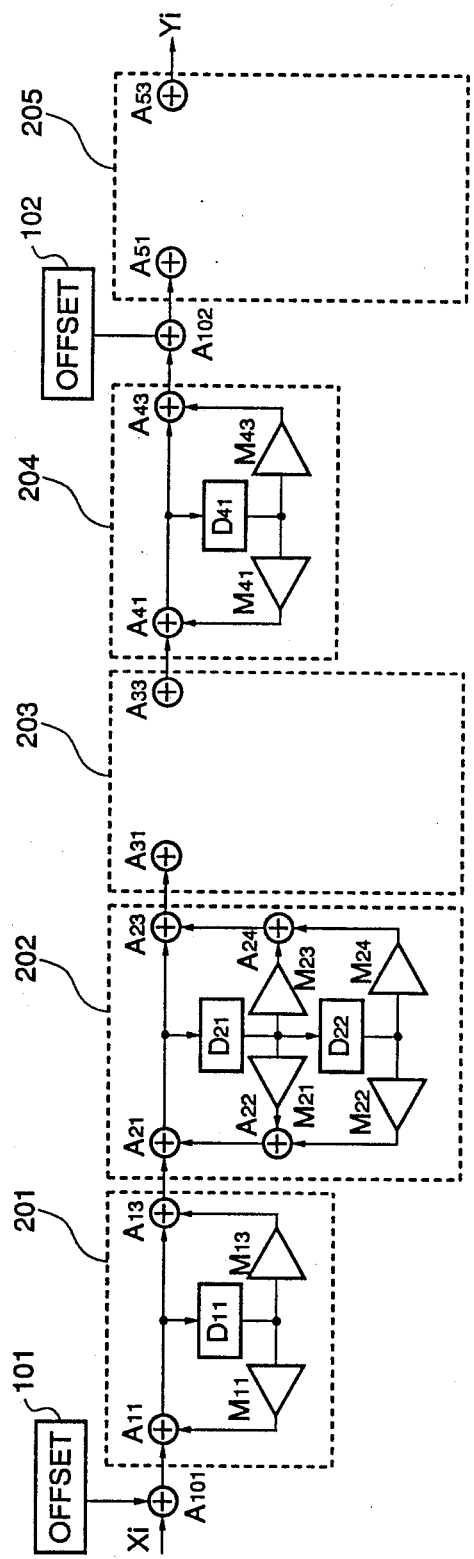
FIG. 3 is a block diagram of another embodiment of the recursive digital filter in accordance with the present invention.

Turning to FIG. 3, there is shown a block diagram of another embodiment of the recursive digital filter in accordance with the present invention. The recursive digital filter shown in FIG. 3 is of the cascade-coupled type, which includes five recursive digital filter loops 201, 202, 203, 204 and 205 cascaded in the named order. In this embodiment, considering the characteristics of passband of the respective recursive digital filter loops, offset means (including an offset value circuit and an adder) is provided at an input of only certain ones of the recursive digital filter loops.

An input signal Xi is inputted to a first input of an offsetting adder $A_{101}$, which has a second input connected to a first offset value circuit 101. An output of the offsetting adder $A_{101}$ is connected to a first input of an adder $A_{11}$ of the first recursive digital filter loop 201. An output of the adder $A_{11}$ is connected to an input of the delay unit $D_{11}$ and a first input of another adder $A_{13}$. An output of the delay unit $D_{11}$ is connected to respective inputs of the multipliers $M_{11}$ and $M_{13}$. The multiplier $M_{11}$ multiplies the output of the delay unit $D_{11}$ by a predetermined constant, and the multiplier $M_{13}$ multiplies the output of the delay unit $D_{11}$ by another predetermined constant. An output of the multiplier $M_{11}$ is connected to a second input of the adder $A_{11}$, and an output of the multiplier $M_{13}$ is connected to a second input of the adder $A_{13}$. An output of the adder $A_{13}$ forms an output of the first recursive digital filter loop 201. The digital filter loop thus formed constructs a first-order recursive digital filter loop.

The output of the adder $A_{13}$ is connected to a first input of an adder $A_{21}$ of the second recursive digital filter loop 202. An output of the adder $A_{21}$ is connected to an input of the delay unit $D_{21}$ and a first input of an adder $A_{23}$. An output of the delay unit $D_{21}$ is connected to respective inputs of the multipliers $M_{21}$ and $M_{23}$ and an input of another delay unit $D_{22}$. The multiplier $M_{21}$ multiplies the output of the delay unit $D_{21}$ by a first constant, and the multiplier $M_{23}$ multiplies the output of the delay unit $D_{21}$ by a second constant. An output of the delay unit $D_{22}$ is connected to respective inputs of the multipliers $M_{22}$ and $M_{24}$. The multiplier $M_{22}$ multiplies the output of the delay unit $D_{22}$ by a third constant, and the multiplier $M_{24}$ multiplies the output of the delay unit $D_{22}$ by a fourth constant. Outputs of the multipliers $M_{21}$ and $M_{22}$ are connected to two inputs of an adder $A_{22}$, respectively, so that the outputs of the multipliers $M_{21}$ and $M_{22}$ are added to each other, and an output of the adder $A_{22}$ is connected to a second input of the adder $A_{21}$. On the other hand, outputs of the multipliers $M_{23}$ and $M_{24}$ are connected to two inputs of an adder $A_{24}$, respectively, and an output of the adder $A_{24}$ is connected to a second input of the adder $A_{23}$. An output of the adder $A_{24}$ forms an output of the second recursive digital filter loop 202. Therefore, the second recursive digital filter loop 202 is a second-order recursive digital filter loop.

The third and fifth recursive digital filter loops 203 and 205 have the same construction as that of the second recursive digital filter loop 202. For simplification of the drawings, therefore, an internal structure of each of the third and fifth recursive digital filter loops 203 and 205 are omitted from FIG. 3, and explanation thereof will be omitted. In addition, the fourth recursive digital filter loop 204 have the same construction as that of the first recursive digital filter loop 201. Therefore, although an internal structure of the fourth recursive digital filter loop 204 is shown in FIG. 3, explanation thereof will be omitted. An output of the fourth recursive digital filter loop 204 (an output of an adder $A_{43}$) is connected to a first input of another offsetting adder $A_{102}$, which has a second input connected to a second offset value circuit 102. An output of the offsetting adder $A_{102}$ is connected to an input of the fifth recursive digital filter loop 205 and hence an first input of an adder $A_{51}$. An output of an adder $A_{53}$ of the fifth recursive digital filter loop 205 generates an output signal Yi of the shown cascaded recursive digital filter.

In the above mentioned cascaded recursive digital filter, the first, second and third recursive digital filter loops 201, 202 and 203 are adapted to form a low-pass filter, and on the other hand, the fourth and fifth recursive digital filter loops 204 and 205 are adapted to form a high-pass filter, so that the shown cascaded recursive digital filter forms a bandpass filter as a whole.

As explained above, a first offset value given by the first offset value circuit 101 is added by the adder $A_{101}$ to the input signal Xi at the input of the low-pass filter. Therefore, this first offset value is considered to be a DC level input. Accordingly, the first offset value component can pass through the low-pass filter, and is applied to the input of the fourth digital filter loop 204 of the high-pass filter. Namely, the application of the DC level offset to the input of the low-pass filter is equivalent to application of a DC level offset to an input of a high-pass filter. In the shown embodiment, since the DC level offset value given by the first offset value circuit 101 is blocked in the fourth digital filter loop 204 of the high-pass filter, another offset is newly applied to the input of the fifth digital filter loop 205 by cooperation of the second offset value circuit 102 and the adder $A_{102}$.

As will be understood from the second embodiment, if the digital filter includes a plurality of cascaded recursive digital filter loops, it is not necessary to apply an independent offset value to an input of each of the recursive digital filter digital filter loops. Accordingly, the limit cycle due to the rounding error can be effectively prevented in the cascaded type of recursive digital filter with only addition of a small amount of hardware.

As will be apparent from the above explanation of the embodiment with reference to the accompanying drawings, the recursive digital filter in accordance with the present invention can prevent the limit cycle in a no-signal condition with only addition of a small amount of hardware to the conventional recursive digital filter.

Furthermore, since the recursive digital filter in accordance with the present invention can prevent the limit cycle without elongating the length of an operation word to be processed, it is possible to set the length of the operation word to a required minimum value which is adapted to a frequency characteristics of the filter, and therefore, it is also possible to optimize the amount of hardware including adders, multipliers, delay units, and the likes.

The invention has thus been shown and described with reference to the specific embodiments. However, it should be noted that the present invention is in no way limited to the details of the illustrated structures but changes and modifications may be made within the scope of the appended claims.

I claim:

1. A recursive digital filter comprising an input terminal receiving an input signal, an output terminal for outputting a filtered signal, an offset value circuit for outputting a predetermined offset value, an offsetting adder having a first input connected to said input terminal and a second input connected to receive said predetermined offset value from said offset value circuit, and a recursive digital filter loop having an input connected to an output of said offsetting adder and an output connected to said output terminal, whereby even if no signal is inputted, the recursive digital filter operates without occurrence of a limit cycle.

2. A recursive digital filter claimed in claim 1 wherein said recursive digital filter loop includes a first adder having a first input connected to said output of said offsetting adder, a first delay unit having an input connected to an output of said first adder, first and second multipliers having their inputs connected to an output of said first delay unit, said first and second multipliers operating to multiply the output of said first delay unit by first and second predetermined constants, respectively, and an output of said first multiplier being connected to a second input of said first adder, and a second adder having a first input connected to said output of said first adder and a second input connected to an output of said second multiplier, an output of said second adder being connected to said output terminal.

3. A recursive digital filter claimed in claim 2 wherein said recursive digital filter loop further includes a second delay unit having an input connected to said output of said first delay unit, third and fourth multipliers having their inputs connected to an output of said second delay unit, said third and fourth multipliers operating to multiply the output of said second delay unit by third and fourth predetermined constants, respectively, a third adder having first and second inputs connected to outputs of said first and third multipliers, respectively, an output of said third adder being connected to said second input of said first adder, and a fourth adder having first and second inputs connected to outputs of said second and fourth multipliers, respectively, said second input of said second adder being connected to an output of said fourth adder.

4. A cascaded recursive digital filter comprising an input terminal receiving an input signal, an output terminal for outputting a filtered signal, a first offset value circuit for outputting a first predetermined offset value, a first offsetting adder having a first input connected to said input terminal and a second input connected to receive said first predetermined offset value from said first offset value circuit, a low-pass recursive digital filter having an input connected to an output of said first offsetting adder, and a high-pass recursive digital filter having an input connected to an output of said low-pass recursive digital filter and an output connected to said output terminal, whereby even if no signal is inputted, the cascaded recursive digital filter operates without occurrence of a limit cycle.

5. A cascaded recursive digital filter claimed in claim 4 wherein said high-pass recursive digital filter includes a first recursive digital filter loop having an input connected to an output of said low-pass recursive digital filter, a second offset value circuit for outputting a second predetermined offset value, a second offsetting adder having a first input connected to an output of said first recursive digital filter loop and a second input connected to receive said second predetermined offset value from said second offset value circuit, and a second first recursive digital filter loop having an input connected to an output of said second offsetting adder and an output connected to said output terminal.

* * * * *